(12) United States Patent
Chen

(10) Patent No.: US 7,710,695 B2
(45) Date of Patent: May 4, 2010

(54) INTEGRATED CIRCUIT AND ELECTROSTATIC DISCHARGE PROTECTION CIRCUIT

(75) Inventor: Ke-Yuan Chen, Taipei County (TW)

(73) Assignee: Via Technologies, Inc., Taipei (TW)

(*) Notice: Subject to any disclaimer, the term of this patent is extended or adjusted under 35 U.S.C. 154(b) by 408 days.

(21) Appl. No.: 11/757,434

(22) Filed: Jun. 4, 2007

(65) Prior Publication Data
US 2008/0297960 A1    Dec. 4, 2008

(51) Int. Cl.
*H02H 9/00* (2006.01)

(52) U.S. Cl. .......................................... 361/56

(58) Field of Classification Search .................... 361/56
See application file for complete search history.

(56) References Cited

U.S. PATENT DOCUMENTS

| | | | | |
|---|---|---|---|---|
| 5,946,177 A | * | 8/1999 | Miller et al. | 361/56 |
| 6,002,568 A | * | 12/1999 | Ker et al. | 361/111 |
| 6,118,640 A | * | 9/2000 | Kwong | 361/56 |
| 6,538,868 B2 | * | 3/2003 | Chang et al. | 361/111 |
| 6,771,052 B2 | * | 8/2004 | Ostojic | 323/266 |
| 2007/0030610 A1 | * | 2/2007 | Ker et al. | 361/56 |

* cited by examiner

*Primary Examiner*—Stephen W Jackson
*Assistant Examiner*—Ann T Hoang
(74) *Attorney, Agent, or Firm*—Thomas, Kayden, Horstemeyer & Risley

(57) ABSTRACT

An integrated circuit and a protection circuit capable of protecting electrostatic discharge (ESD) damage. The integrated circuit comprises a first pad, a ground pad, a second pad, a device circuitry, a discharging unit, and a discharging controller. The discharging unit comprises first and second transistors in series. The discharging controller comprises an ESD connection unit, and a voltage clamping unit. The ESD connection unit, coupled to the first pad and the discharging unit, receives an ESD pulse to establish a first control voltage to turn on the first transistor in the ESD event. The voltage clamping unit, coupled to the ESD connection unit and the first, second and ground pads, clamps the ESD pulse to establish a second control voltage to turn on the second transistor in the ESD event, and receives an operation voltage at the first pad to turn off the second transistor in normal operation.

16 Claims, 6 Drawing Sheets

INTEGRATED CIRCUIT AND ELECTROSTATIC DISCHARGE PROTECTION CIRCUIT

BACKGROUND OF THE INVENTION

1. Field of the Invention

The invention relates to an integrated circuit, and in particular to electrostatic discharge (ESD) protection circuits.

2. Description of the Related Art

Integrated circuits (IC) utilize input/output (I/O) drivers to interface with external circuitry and data connections, there exists an increasing demand for I/O drivers which can tolerate high drain and gate voltages without incurring hot carrier or gate oxide degradation. The scaling of gate oxides in deep sub-micron technologies in combination with customer demands for mixed voltage product applications has forced designers to create I/O drivers which meet requirements.

Integrated circuits comprise semiconductor devices that are susceptible to damage from electrical overstress conditions (EOS), including electrostatic discharge (ESD), transient conditions, latch-up, incorrect polarity connections. The electrical overstress conditions are characterized by overvoltage and over-current stress events. Electrostatic charge (ESC) can accumulate in a body and damage semiconductor devices and circuitry therein if the body is brought into contact with the ICs. Thus efforts have been put though to protect semiconductor devices from electrostatic discharge and other electrical overstress conditions.

FIG. 1 is a circuit schematic of a conventional electrostatic discharge protection circuitry in an integrated circuit, comprising PMOS transistor M10, NMOS transistors M12 and M14, and resistor R10.

NMOS transistors stacked in a cascade configuration provide robust ESD protection for mixed voltage I/O in semiconductor technologies. Stacked NMOS M12 and M14 provide ESD protection to internal components of the integrated circuit to prevent from exposure to excessive currents in an ESD event. The stacked NMOS configuration also protects the integrated circuit from excessive currents in transient condition during normal operation. However, this kind of device has high snapback voltage. Also, the high snapback voltage of the stacked NMOS degrades second breakdown trigger current IT2 since the power dissipation is great, resulting in poor ESD performance in the stacked NMOS circuit configuration. Thus a need exists for ESD protection in high voltage tolerant I/O.

BRIEF SUMMARY OF THE INVENTION

A detailed description is given in the following embodiments with reference to the accompanying drawings.

According to an embodiment of the invention, an integrated circuit capable of protecting electrostatic discharge (ESD) damage comprises a first pad, a ground pad, a second pad, a device circuitry, a discharging unit, and a discharging controller. The discharging unit, coupled to the device circuitry, and the first, second and ground pads, comprises first and second transistors in series to protect the device circuitry from a stress current at the first, second, or ground pads in an ESD event. The discharging controller, coupled to the discharging unit, and the first, second and ground pads, comprises an ESD connection unit, and a voltage clamping unit. The ESD connection unit, coupled to the first pad and the second pad, receives an ESD pulse to establish a first control voltage to turn on the first transistor in the ESD event. The voltage clamping unit, coupled to the ESD connection unit and the first, second and ground pads, clamps the ESD pulse to establish a second control voltage to turn on the second transistor in the ESD event, and receives an operation voltage at the first pad to turn off the second transistor in normal operation.

Also protection circuit capable of protecting electrostatic discharge (ESD), adapted to be coupled to a first pad, a ground pad, a second pad, and a device circuitry, comprising a discharging unit and a discharging controller. The discharging unit includes a first NMOS transistor and a second NMOS transistor. The first NMOS transistor has a first source, first drain, and first gate, the first drain is coupled to the second pad, and the first gate is coupled to the first pad. The second NMOS transistor has a second source, second drain, and second gate, the second drain is coupled to the first source, and the second source is coupled to the ground pad. The discharging controller includes an ESD connection unit, a first PMOS transistor, a third NMOS transistor, a first resistor, and a first capacitor. The ESD connection unit, coupled to the first pad and the second pad, receives an ESD pulse to establish a first control voltage to turn on the first NMOS transistor in an ESD event. The first PMOS transistor has a source, drain, and gate, the source of the first PMOS is coupled to the ESD connection unit and the first gate. The third NMOS transistor has a third source, third drain, and third gate, the third drain is coupled to the drain of the first PMOS, the third source is coupled to the ground pad. The first resistor is coupled to the second pad. The first capacitor is coupled to the first transistor, the gate of the first PMOS and the third gate at one end, and to the ground pad at another end. The first capacitor clamps the ESD pulse to establish a second control voltage to turn on the second NMOS transistor in the ESD event, and receives an operation voltage at the first pad to turn off the second NMOS transistor in normal operation. The discharging unit protects the device circuitry from a stress current at the first, the second, or ground pads in an ESD event.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
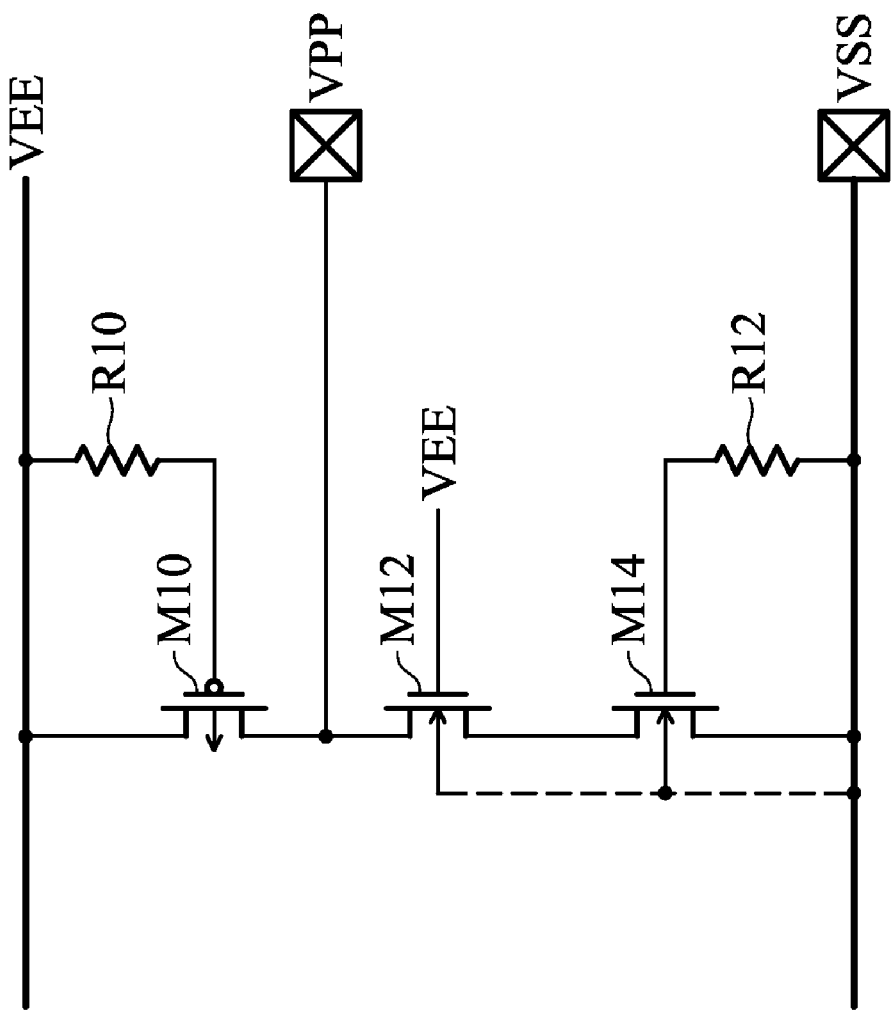
FIG. 1 is a circuit schematic of a conventional electrostatic discharge protection circuitry.
Figure 2:
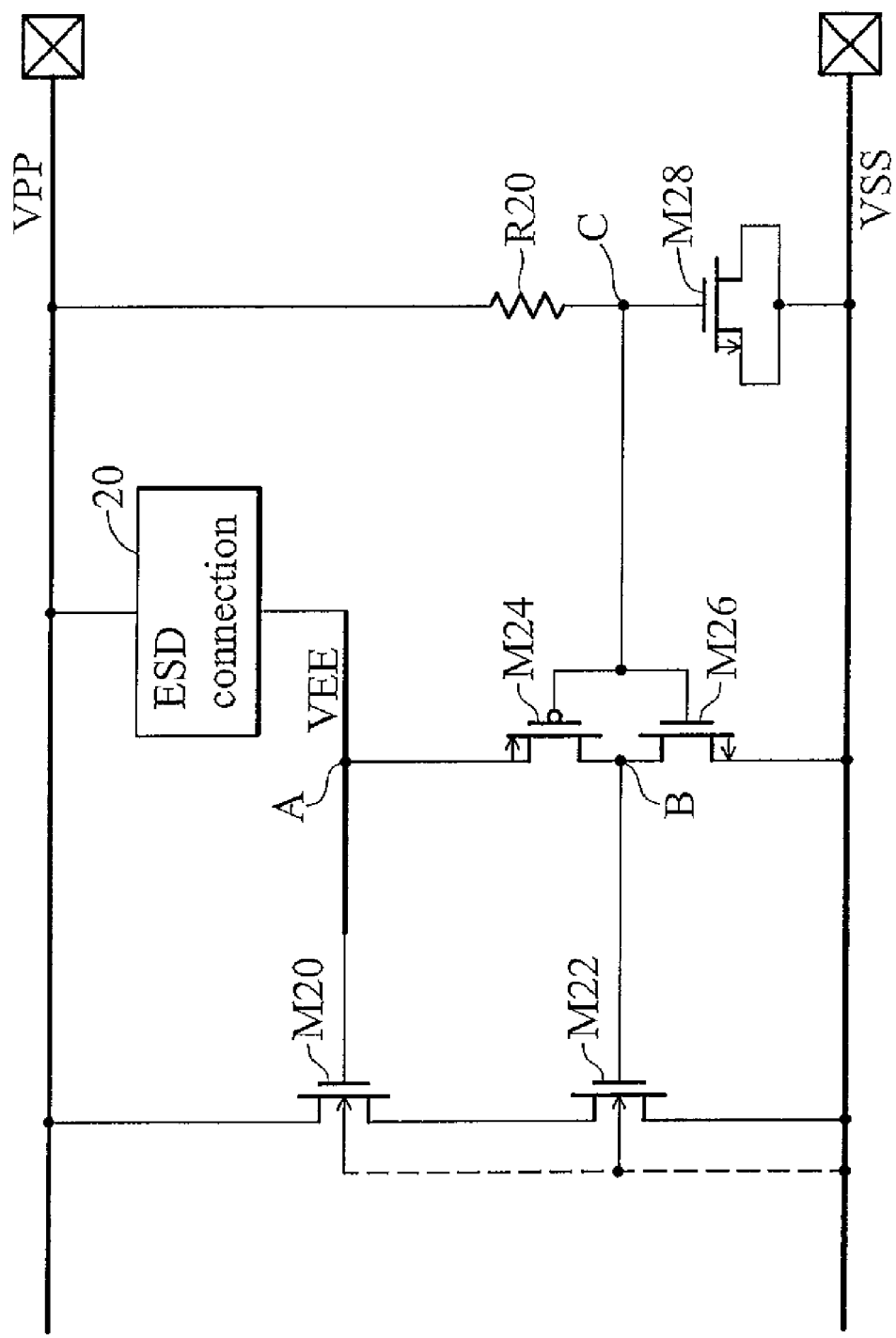
FIG. 2 is a circuit schematic of an exemplary ESD protection circuit in an integrated circuit.

FIG. 2 is a circuit schematic of an exemplary electrostatic discharge (ESD) protection circuit in an integrated circuit, comprising ESD connection module 20, NMOS transistors M20 and M22, PMOS transistor M24, NMOS transistor M26, MOSCAP M28 and resistor R20.

The integrated circuit may be a logic or memory device. In operation, the integrated circuit is coupled with other circuitry, external power supplies and data connections. The integrated circuit constitutes semiconductor materials such as silicon and insulating materials such as silicon oxide, both can suffer permanent damage when subjected to high voltages. In particularly, the integrated circuit is susceptible to electrostatic discharge events prior to application within an electrical device and connection with external devices. The ESD protection circuit is capable of protecting ESD, and is adapted to be coupled to first pad, ground pad VSS, second pad, and an internal circuitry (not shown), wherein a working voltage at the first pad is less than that at the second pad. In this embodiment, the first pad may be a first power pad VEE. The second pad may be a second power pad VPP. However, those skilled in the art can make various modifications and variations, depending on the different demands.

NMOS transistor M20 has a first NMOS source, first NMOS drain, and first NMOS gate. First NMOS drain is coupled to second power pad VPP, and the first gate is coupled to first power pad VEE. NMOS transistor M22 having a second NMOS source, second NMOS drain, and second NMOS gate. The second drain is coupled to the first NMOS source, and the second source is coupled to the ground pad VSS. ESD connection unit 20 is coupled to the second power pad VPP and the first power pad VEE, receives an ESD pulse from second power pad VPP to establish first control voltage A to turn on the transistor M20 in an ESD event. The PMOS transistor M24 has a first PMOS source, first PMOS drain, and first PMOS gate, the first PMOS source is coupled to ESD connection unit 20 and the first NMOS gate. NMOS transistor 26 has a third NMOS source, third NMOS drain, and third NMOS gate. The third NMOS drain is coupled to the first PMOS drain, the third NMOS source is coupled to ground pad VSS. Resistor 20 is coupled to second power pad VPP. MOSCAP M28 is coupled to resistor 20, the first PMOS gate and the third NMOS gate at one end, and to the ground pad VSS at another end.

First power pad VEE or second power pad VPP receives power supply from an external source (not shown). Voltage potential received at first power pad VEE is lower than those received at second power pad VPP. Exemplary voltage is 2.5V at first power pad VEE and 4V at second power pad VPP in 65 nm semiconductor fabrication process. Ground pad VSS is at a voltage potential less than first power pad VEE and second power pad VPP, typically at 0V.

Stacked NMOS transistors M20 and M22 provide a discharging unit to protect internal circuitry from stress current which may pass into or out of the integrated circuit via first power pad VEE, second power pad VPP, and ground pad VSS. The discharging unit provide a discharge path between any two pads in first power pad VEE, second power pad VPP, and ground pad VSS, such that the stress current arising from ESD is redirected externally to the integrated circuit without damaging internal circuitry. NMOS transistors M20 and M22 are both turned on to provide the discharge path to shunt the stress current from second power pad VPP to ground pad VSS in an event of ESD.

ESD connection 20, PMOS transistor M24, NMOS transistor M26, resistor R20, and MOSCAP M28 provide a discharge controller to control operation of the discharging unit under ESD and normal operating conditions. When an ESD event occurs, ESD connection 20 receives an ESD pulse from second power pad VPP, reduces some voltage potential thereof, and establishes the first control voltage A to turn on NMOS transistor M20.

Resistor R20, MOSCAP M28, PMOS transistor M24, and NMOS transistor M26 constitute a voltage clamping unit clamping the ESD pulse to establish second control voltage B to turn on NMOS transistor M22 in the ESD event, and receiving an operation voltage at second power pad VPP to turn off NMOS transistor M22 in normal operation. When the ESD event occurs, MOSCAP M28 acts to clamp the ESD pulse to establish a clamped voltage such that the clamped voltage is less than first control voltage, thereby turning on PMOS transistor M24 and turning off NMOS transistor M26. The inverter (PMOS transistor M24 and NMOS transistor M26) inverts the clamped voltage to generate the second control voltage B and turn on the second NMOS transistor M22 in the discharging unit. Because both the first and second control voltages A, B are initialized by one common ESD pulse, the stacked NMOS transistors are turned on in a fast and uniform manner, discharging the stress current from second power pad VPP and ground pad VSS. In normal operation, MOSCAP M28 is charged to a voltage potential substantially equivalent to the power voltage at second power pad VPP, the voltage potential is inverted by the inverter to generate the second control voltage B to shut off NMOS transistor M22, reducing current leakage during the normal operation. Resistor R20 provides basic protection to prevent NMOS transistor 26 and MOSCAP M28 from oxide breakdown.

The MOS transistors utilized in the ESD protection circuit may be thin-oxide MOS devices.

Figure 3A:
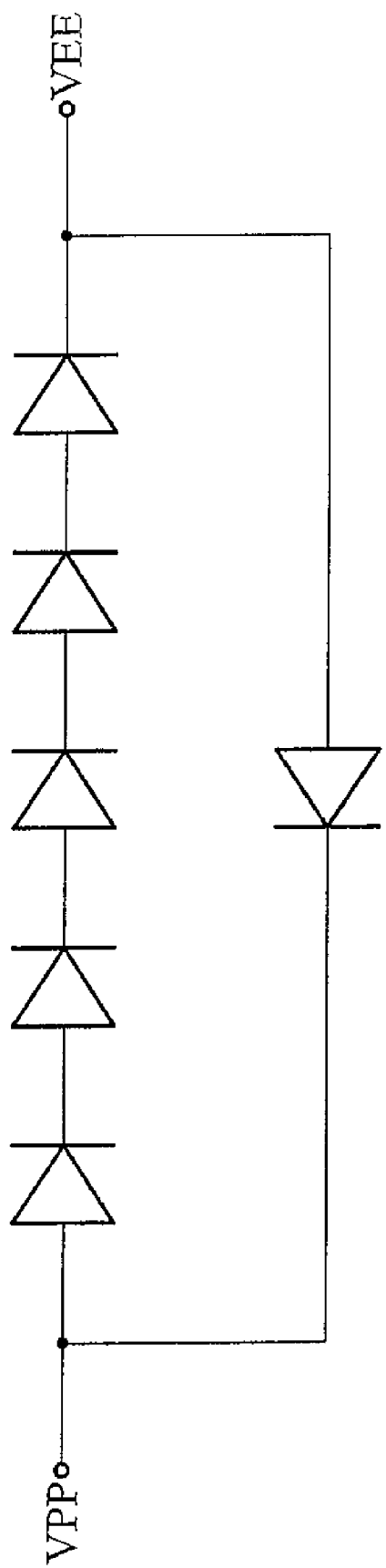
FIG. 3a is a circuit schematic of an exemplary ESD connection unit incorporated in the protection circuit in FIG. 2.

FIG. 3a is a circuit schematic of an exemplary ESD connection unit incorporated in the protection circuit in FIG. 2, comprising a plurality of forward biased diodes connected in series, in conjunction with a reverse biased diode coupled in parallel.

Figure 3B:
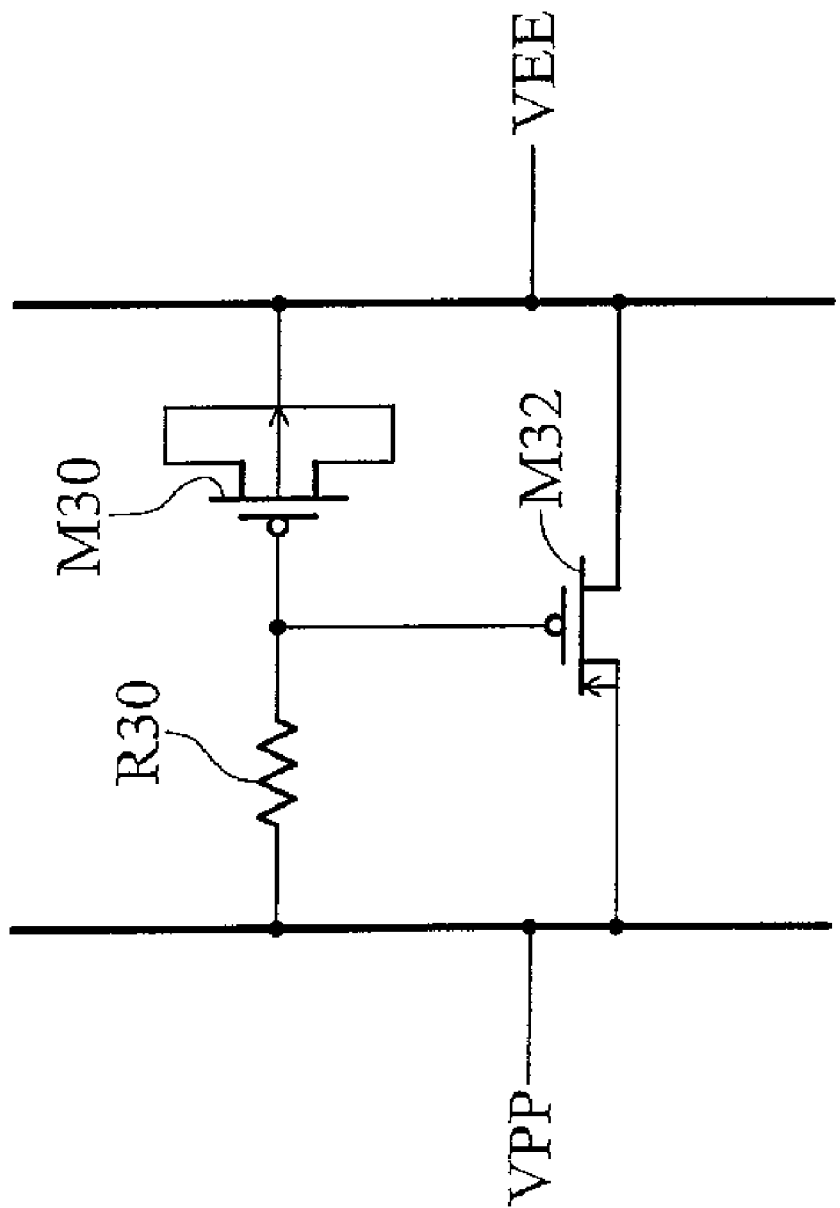
FIG. 3b is a circuit schematic of another exemplary ESD connection unit incorporated in the protection circuit in FIG. 2.

FIG. 3b is a circuit schematic of another exemplary ESD connection unit incorporated in the protection circuit in FIG. 2, comprising resistor R30 and MOSCAP M30 coupled in series, in conjunction with transistor M32 coupled in parallel.

Figure 4:
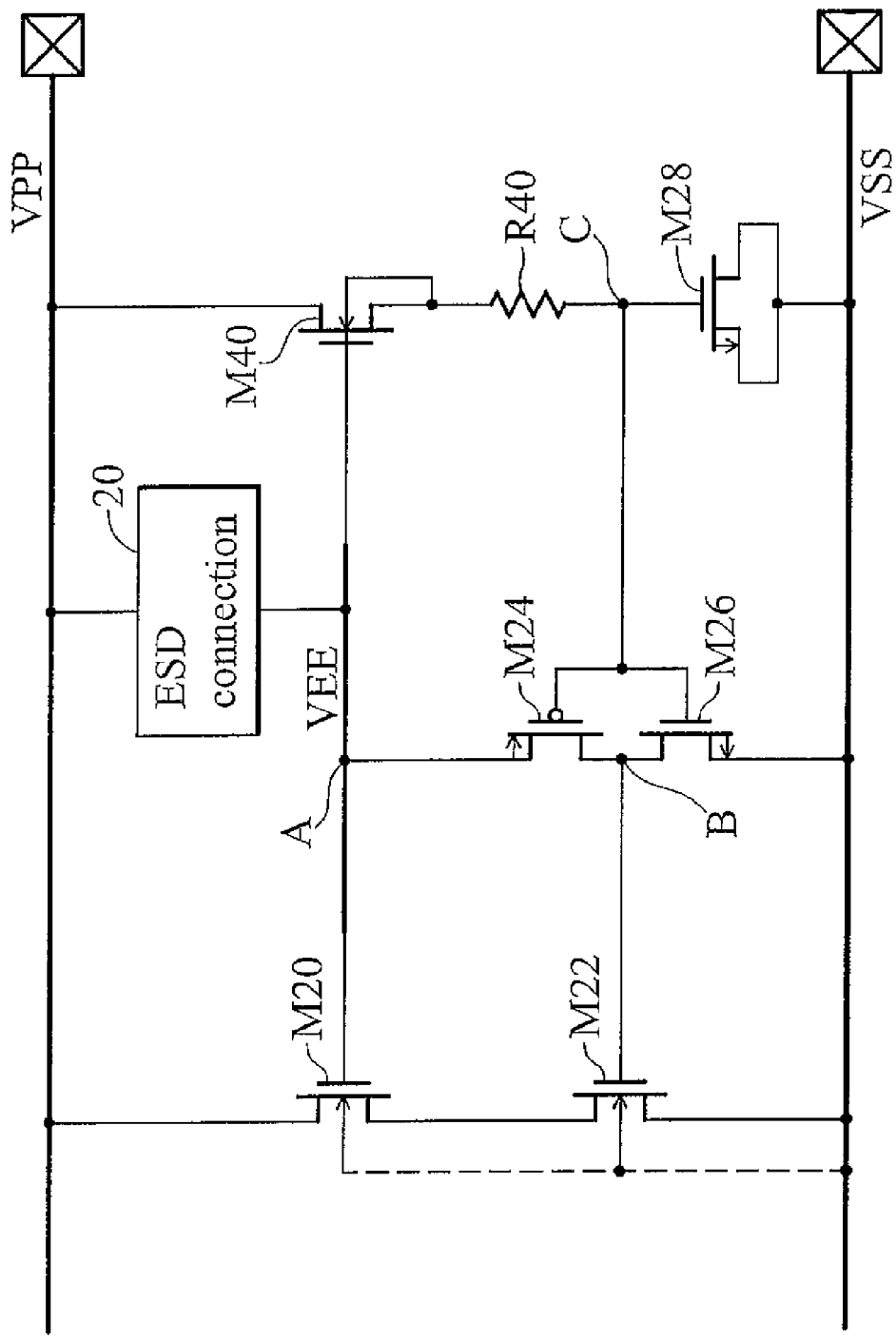
FIG. 4 is a circuit schematic of another exemplary ESD protection circuit.

FIG. 4 is a circuit schematic of another exemplary ESD protection circuit, further comprising transistor M40 on the top of the protection circuit arrangement in FIG. 2. NMOS transistor M40 has a drain coupled to second power pad VPP, a gate coupled to ESD connection 20, and a source coupled to resistor R40.

In normal operation, NMOS transistor M40 reduces voltage potential C to (VEE-$V_{th\_M40}$) so that voltages across transistors M26 and M28 can remain within the oxide breakdown voltage, providing better circuit reliability in comparison to the protection circuit in FIG. 2. The voltage potential (VEE-$V_{th\_M40}$) at node C turns NMOS transistor M26 on to pull down voltage potential C, in turn shut down NMOS transistor 22 to prevent current leakage. To reduce leakage current in the protection circuit, the threshold voltage $V_{th\_M40}$ of transistor M40 is selected such that combination of threshold voltages of NMOS transistor M40 and PMOS transistor M24 is less than zero, thereby reducing the leakage current of the inverter (M24 and M26). The device process variation is taken into consideration to keep the combination of threshold voltages $V_{th\_M40}$ and $V_{th\_M24}$ below zero.

The power voltage at second power pad VPP is turned fully on prior to the power voltage at first power pad VEE in the normal operation to prevent power voltage being clamped by ESD protection.

Figure 5:
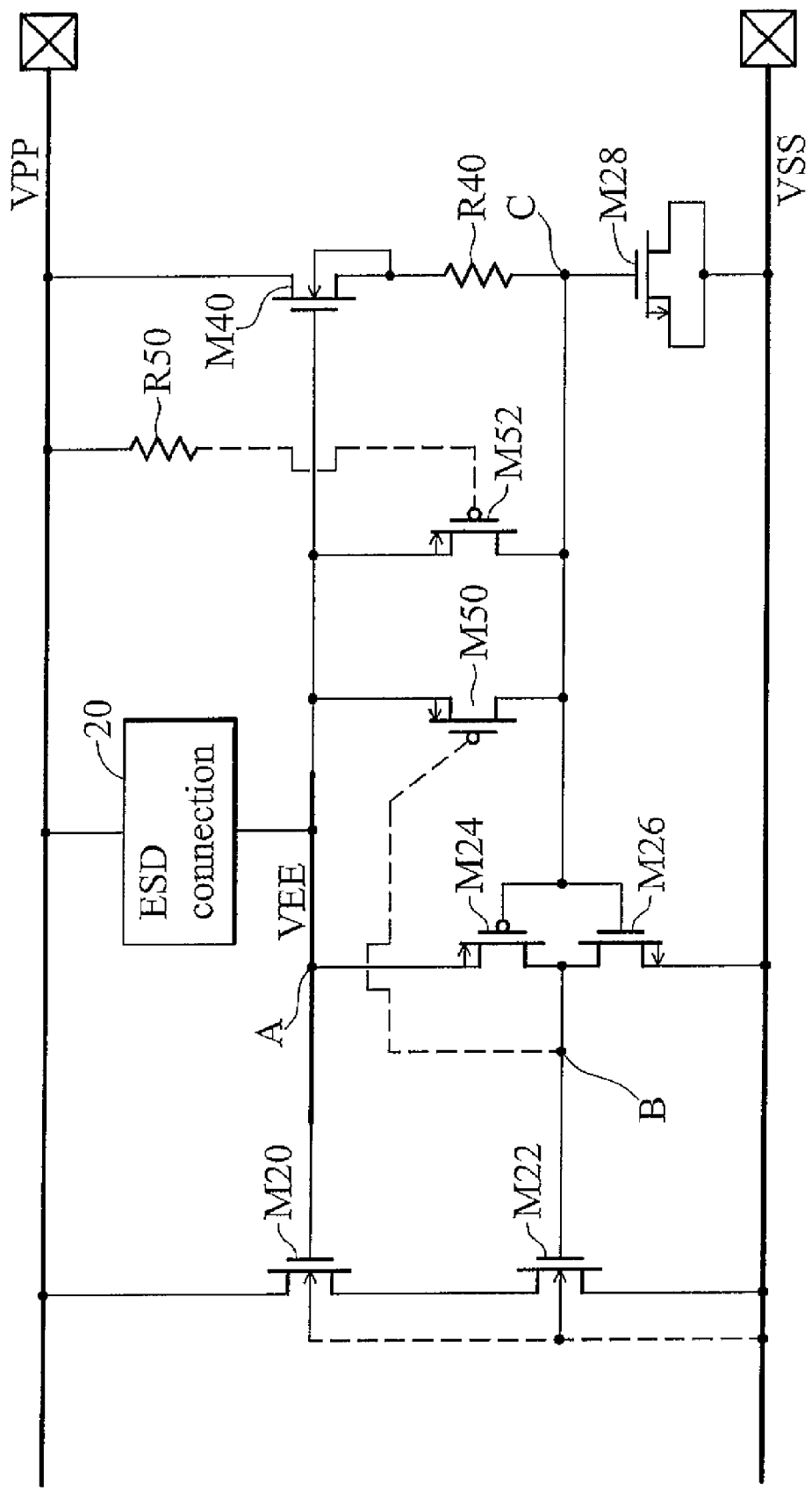
FIG. 5 is a circuit schematic of yet another exemplary ESD protection circuit.

FIG. 5 is a circuit schematic of yet another exemplary ESD protection circuit, further comprising a compensation circuitry and a detection circuitry in the protection circuit of FIG. 4.

The compensation circuitry includes PMOS transistor M50 having a drain, source, and gate. In normal operation, PMOS transistor M50 drives the input voltage of the inverter (MOS transistors M24 and M26) high enough to turn off PMOS transistor M24 and NMOS transistor M22, reducing current leakage. The gate of the PMOS transistor M50 is coupled to the drains of MOS transistor M24 and M26, the source of PMOS transistor M50 is coupled to first power pad VEE, and the drain of PMOS transistor M50 is coupled to the gates of MOS transistors M24 and M26.

The detection circuitry includes resistor R50 and PMOS transistor M52. Resistor R50 is coupled to second power pad VPP. PMOS transistor M52 has a drain, source, and gate. In normal operation, PMOS transistor M52 drives an input voltage of the inverter high enough to turn off PMOS transistor M24 and NMOS transistor M22, if a power voltage at the first power pad VEE is turned on prior to a power voltage at second power pad VPP. The detection circuitry provides a mechanism to prevent occurrence of circuit latch-up, regardless of the power sequence order of the power voltages at the second pad VPP and the first power pad VEE. The gate of PMOS transistor M52 is coupled to the resistor R50, the source of PMOS transistor M52 is coupled to first power pad VEE, and the drain of PMOS transistor M52 is coupled to the gates of MOS transistors M24 and M26.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit capable of protecting against electrostatic discharge (ESD) damage, comprising:
    a first pad;
    a ground pad;
    a second pad;
    a device circuitry;
    a discharging unit, coupled to the device circuitry, and the first, second and ground pad, comprising a first and a second transistor in series to protect the device circuitry from a stress current at the first, second, or ground pad in an ESD event; and
    a discharging controller, coupled to the discharging unit, and the first, second and ground pad, comprising:
        an ESD connection unit, coupled to the first pad and the second pad, receiving an ESD pulse to establish a first control voltage to turn on the first transistor in the ESD event; and
        a voltage clamping unit, coupled to the ESD connection unit and the first, second and ground pad, clamping the ESD pulse to establish a second control voltage to turn on the second transistor in the ESD event, and receiving an operation voltage at the second pad to turn off the second transistor in normal operation,
        wherein the voltage clamping unit comprises an inverter comprising a third and a fourth transistor in series, the third transistor is coupled to the first pad and the fourth transistor, and the fourth transistor is coupled to the ground pad and the third transistor;
    wherein the discharging controller further comprises a fifth transistor coupled to the ESD connection unit, the second pad, and the first resistor; and
    wherein combination of threshold voltages of the third and the fifth transistor is less than zero volts.

2. The integrated circuit of claim 1, wherein the voltage clamping unit further comprises:
    a first resistor, and
    a first capacitor, coupled to the first resistor and the ground pad, clamping the ESD pulse to establish a clamped voltage such that the clamped voltage is less than the first control voltage in the ESD event, and establishing the clamped voltage substantially equivalent to a voltage potential at the second pad in the normal operation, wherein the inverter is coupled to the ESD connection unit and the discharging unit, inverting the clamped voltage to generate the second control voltage.

3. The integrated circuit of claim 2, further comprising a compensation circuitry, coupled to the inverter and the first pad, driving an input voltage of the inverter high enough to turn off the second transistor in the normal operation.

4. The integrated circuit of claim 2, further comprising a detection circuitry, coupled to the first and second pad, and the inverter, driving an input voltage of the inverter high enough to turn off the second transistor in the normal operation, if a voltage at the first pad is turned on prior to a voltage at the second pad.

5. The integrated circuit of claim 1, wherein a voltage at the first pad exceeds a voltage at the second pad, and the voltage at the second pad is turned fully on prior to the voltage at the first pad in the normal operation.

6. The integrated circuit of claim 1, wherein the ESD connection unit comprises a plurality of forward biased diodes connected in series, in conjunction with a reverse biased diode coupled in parallel.

7. The integrated circuit of claim 1, wherein the ESD connection unit comprises a second resistor and a second capacitor coupled in series, in conjunction with a sixth transistor coupled in parallel.

8. The integrated circuit of claim 1, wherein a working voltage at the first pad is lower than that at the second pad.

9. A protection circuit capable of protecting against electrostatic discharge (ESD), adapted to be coupled to a first pad, a ground pad, a second pad, and a device circuitry, comprising:
    a discharging unit including:
        a first NMOS transistor having a first source, first drain, and first gate, the first drain being coupled to the second pad, and the first gate being coupled to the first pad;
        a second NMOS transistor having a second source, second drain, and second gate, the second drain being coupled to the first source, and the second source being coupled to the ground pad; and
    a discharging controller including:
        an ESD connection unit, coupled to the first pad and the second pad, receiving an ESD pulse to establish a first control voltage to turn on the first NMOS transistor in an ESD event;
        a first PMOS transistor having a source, drain, and gate, the source of the first PMOS transistor being coupled to the ESD connection unit and the first gate;
        a third NMOS transistor having a third source, third drain, and third gate, the third drain being coupled to the drain of the first PMOS transistor, the third source being coupled to the ground pad;
        a first resistor coupled to the second pad; and a first capacitor coupled to the first resistor, the gate of the first PMOS transistor and the third gate at one end, and coupled to the ground pad at another end, wherein the first capacitor clamps the ESD pulse to establish a second control voltage to turn on the second NMOS transistor in the ESD event, and receives an operation voltage at the second pad to turn off the second NMOS transistor in normal operation;

wherein the discharging unit protects the device circuitry from a stress current at the first, second, or ground pad in an ESD event; and wherein the discharging controller further comprises a fourth NMOS transistor having a fourth source, fourth drain, and fourth gate, the fourth drain being coupled to the second pad, the fourth gate being coupled to the ESD connection unit, and the fourth source being coupled to the first resistor.

10. The protection circuit of claim 9, wherein combination of threshold voltages of the fourth NMOS transistor and the first PMOS transistor is less than zero volts.

11. The protection circuit of claim 9, further comprising a compensation circuitry including a second PMOS transistor having a drain, source, and gate, and driving an input voltage of an inverter high enough to turn off the second NMOS transistor in the normal operation, the inverter comprises the first PMOS transistor and the third NMOS transistor, the gate of the second PMOS transistor being coupled to the drain of the first PMOS transistor and the third drain, the source of the second PMOS transistor being coupled to coupled to the first pad, and the drain of the second PMOS transistor being coupled to the gate of the first PMOS transistor and the third gate.

12. The protection circuit of claim 9, further comprising a detection circuitry including:

a second resistor coupled to the second pad; and a third PMOS transistor having a drain, source, and gate, and driving an input voltage of an inverter high enough to turn off the second NMOS transistor in the normal operation, the inverter comprises the first PMOS transistor and the third NMOS transistor, if a voltage at the first pad is turned on prior to a voltage at the second pad, the gate of the third PMOS transistor being coupled to the second resistor, the source of the third PMOS transistor being coupled to the first pad, and the drain of the third PMOS transistor being coupled to the gate of the first PMOS transistor and the third gate.

13. The protection circuit of claim 9, wherein a voltage at the first pad exceeds a voltage at the second pad, and the voltage at the second pad is turned fully on prior to the voltage at the first pad in the normal operation.

14. The protection circuit of claim 9, wherein the ESD connection unit comprises a plurality of forward biased diodes connected in series, in conjunction with a reverse biased diode coupled in parallel.

15. The protection circuit of claim 9, wherein the ESD connection unit comprises a third resistor and a second capacitor coupled in series, in conjunction with a fourth PMOS transistor coupled in parallel.

16. The integrated circuit of claim 9, wherein a working voltage at the first pad is lower than that at the second pad.

\* \* \* \* \*